(12) United States Patent
Verbruggen et al.

(10) Patent No.: US 10,886,906 B1
(45) Date of Patent: Jan. 5, 2021

(54) DUTY-CYCLE CORRECTION USING BALANCED CLOCKS

(71) Applicant: Xilinx, Inc., San Jose, CA (US)

(72) Inventors: Bob W. Verbruggen, Saggart (IE); Christophe Erdmann, Dublin (IE); Conrado K. Mesadri, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 21 days.

(21) Appl. No.: 15/989,623

(22) Filed: May 25, 2018

(51) Int. Cl.
  *H03K 5/156* (2006.01)
  *G06F 1/10* (2006.01)
(52) U.S. Cl.
  CPC ............ *H03K 5/1565* (2013.01); *G06F 1/10* (2013.01)
(58) Field of Classification Search
  CPC .............................. H03K 5/156; H03K 5/1565
  See application file for complete search history.

(56) References Cited

U.S. PATENT DOCUMENTS

| 6,507,220 B1 * | 1/2003 | Groen ............... H03K 5/007 326/82 |
| 2012/0154006 A1 * | 6/2012 | Ahn ................ H03K 5/1565 327/175 |
| 2019/0198075 A1 * | 6/2019 | Lee ........................... G11C 8/18 |

OTHER PUBLICATIONS

Menolfi, Christian et al., "A 25Gb/s PAM4 Transmitter in 90nm CMOS SOI, IEEE ISSCC, Digest of Technical Papers, IEEE 2005 International Solid-State Circuits Conference, Feb. 10, 2005, Session 3, pp. 72-73," IEEE, Piscataway, New Jersey, USA.
Menolfi, Christian et al., "A 16Gb/s Source-Series Terminated Transmitter in 65nm CMOS SOI," Digest of Technical Papers, IEEE 2007 International Solid-State Circuits Conference, Feb. 11, 2007, Session 24, pp. 446-447 and 614, IEEE, Piscataway, New Jersey, USA.
Nakamura, Kazuyuki et al., "A CMOS 50% Duty Cycle Repeater Using Complementary Phase Blending," Digest of Technical Papers, IEEE 2000 Symposium on VLSI Circuits, Jun. 15, 2000, pp. 48-49, IEEE, Piscataway, New Jersey, USA.
Song, Young-Hoon et al., "A 0.47-0.66 pJ/bit, 4.8-8 Gb/s I/O Tranceiver in 65nm CMOS," IEEE, J. Solid-State Circuits, May 2013, vol. 48, No. 5, pp. 1276-1289, IEEE, Piscataway, New Jersey, USA.

* cited by examiner

*Primary Examiner* — Diana J. Cheng
(74) *Attorney, Agent, or Firm* — Paradice and Li LLP

(57) ABSTRACT

A duty-cycle adjustment circuit receives a differential pair of input signals and generates an output signal based on the differential pair. The duty-cycle adjustment circuit drives the output signal to a logic-high state based on transitions of a first polarity in a first input signal of the differential pair, and drives the output signal to a logic-low state based on transitions of the first polarity in a second input signal of the differential pair. For example, rising-edge transitions of the output signal may be aligned with rising-edge transitions of the first input signal, and falling-edge transitions of the output signal may be aligned with rising-edge transitions of the second input signal. Alternatively, rising-edge transitions of the output signal may be aligned with falling-edge transitions of the first input signal, and falling-edge transitions of the output signal may be aligned with falling-edge transitions of the second input signal.

18 Claims, 7 Drawing Sheets

DUTY-CYCLE CORRECTION USING BALANCED CLOCKS

GOVERNMENT RIGHTS

This invention was made, in part, with Government support under Agreement No. HR0011-16-3-0004, awarded by Defense Advanced Research Projects Agency. The Government has certain rights in the invention.

TECHNICAL FIELD

Aspects of the present disclosure generally relate to integrated circuits, and specifically to duty-cycle correction for differential clocks used in integrated circuit technology.

BACKGROUND

Differential clocks are used in many high-speed mixed-signal applications. A differential clock is typically formed from two component (e.g., single-ended) clock signals. Ideally, the two component signals are complementary in nature (e.g., the first component signal is in a logic-high state whenever the second component signal is in a logic-low state, and vice-versa) and have a 50% duty cycle (e.g., each component signal is in the logic-high state for 50% of a given clock period and in the logic-low state for 50% of the clock period). Complementary clock signals are desirable to avoid short-circuit currents in differential circuits, while a 50% duty cycle is desirable to achieve accurate sampling in double-data rate (DDR) systems. However, changes in signaling levels (e.g., when converting from current-mode logic (CML) to complementary metal oxide semiconductor (CMOS) logic) may cause non-idealities in a differential clock signal.

Duty cycle distortion may cause deterministic jitter in DDR systems. Even in non-DDR circuits (e.g., which are triggered by only the rising edge of a clock signal), a 50% duty cycle may maximize operation speed, for example, in flip-flops comprising master-slave latches. Thus, it may be desirable to correct for non-idealities in differential clocks, for example, to achieve component signals that are complementary in nature and have a 50% duty cycle.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to a duty-cycle adjustment circuit for differential clock signals. An example duty-cycle adjustment circuit includes an input to receive a differential pair of input signals referred to hereafter as first and second input signals. A first clock generator generates a first output signal based on the differential pair of input signals by driving the first output signal to a logic-high state based on transitions of a first polarity in the first input signal, and driving the first output signal to a logic-low state based on transitions of the first polarity in the second input signal. In some embodiments, a second clock generator may generate a second output signal based on the differential pair of input signals by driving the second output signal to a logic-low state based on transitions of the first polarity in the first input signal, and driving the second output signal to a logic-high state based on transitions of the first polarity in the second input signal. The duty-cycle adjustment circuit may further include an output to provide the first output signal and the second output signal as a differential pair of clock signals.

In some aspects, the first and second input signals are 180 degrees out of phase. In some other aspects, at least one of the first or second input signals may have a duty cycle less than or greater than 50%. Still further, in some aspects, the first output signal may have a 50% duty cycle.

In some embodiments, rising-edge transitions of the first output signal may be aligned with rising-edge transitions of the first input signal, and falling-edge transitions of the first output signal may be aligned with rising-edge transitions of the second input signal. In some other embodiments, rising-edge transitions of the first output signal may be aligned with falling-edge transitions of the first input signal, and falling-edge transitions of the first output signal may be aligned with falling-edge transitions of the second input signal.

The first clock generator may comprise pull-up circuitry configured to drive the first output signal to the logic-high state when the first input signal transitions from a first state to a second state, and pull-down circuitry configured to drive the first output signal to the logic-low state when the second input signal transitions from a third state to a fourth state. In some embodiments, the pull-up circuitry may be further configured to prevent the first output signal from transitioning to a different logic state when the second input signal transitions from the fourth state to the third state. In some other embodiments, the pull-down circuitry may be further configured to prevent the first output signal from transitioning to a different logic state when the first input signal transitions from the second state to the first state.

An example method disclosed herein may be used to operate a duty-cycle adjustment circuit for differential clock signals. The method may include receiving a differential pair of input signals; and generating a first output signal based on the differential pair of input signals by driving the first output signal to a logic-high state based on transitions of a first polarity in a first input signal of the differential pair, and driving the first output signal to a logic-low state based on transitions of the first polarity in a second input signal of the differential pair. In some embodiments, the method may further include generating a second output signal based on the differential pair of input signals by driving the second output signal to a logic-low state based on transitions of the first polarity in the first input signal, and driving the second output signal to a logic-high state based on transitions of the first polarity in the second input signal; and outputting the first output signal and the second output signal as a differential pair of clock signals.

In some aspects, the first and second input signals are 180 degrees out of phase. In some other aspects, at least one of the first or second input signals may have a duty cycle less than or greater than 50%. Still further, in some aspects, the first output signal may have a 50% duty cycle.

In some embodiments, rising-edge transitions of the first output signal may be aligned with rising-edge transitions of the first input signal, and falling-edge transitions of the first output signal may be aligned with rising-edge transitions of the second input signal. In some other embodiments, rising-edge transitions of the first output signal may be aligned with falling-edge transitions of the first input signal, and falling-edge transitions of the first output signal may be aligned with falling-edge transitions of the second input signal.

The step of generating the first output signal may include steps of driving the first output signal to the logic-high state when the first input signal transitions from a first state to a second state; and driving the first output signal to the logic-low state when the second input signal transitions from a third state to a fourth state. In some embodiments, the step of generating the first output signal may further include a step of preventing the first output signal from transitioning to a different logic state when the second input signal transitions from the fourth state to the third state. In some other embodiments, the step of generating the first output signal may further include a step of preventing the first output signal from transitioning to a different logic state when the first input signal transitions from the second state to the first state.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1A:
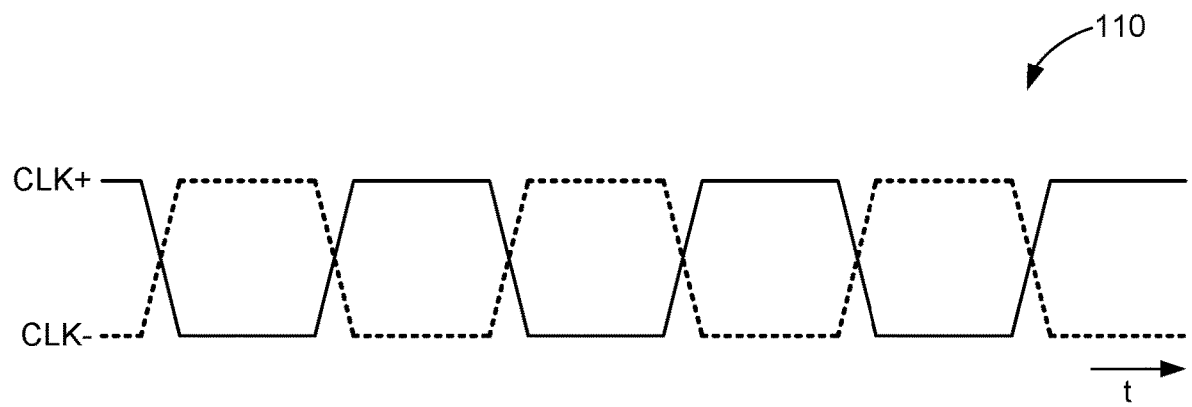
FIG. 1A shows an example timing diagram depicting an ideal differential clock signal.
Figure 1B:
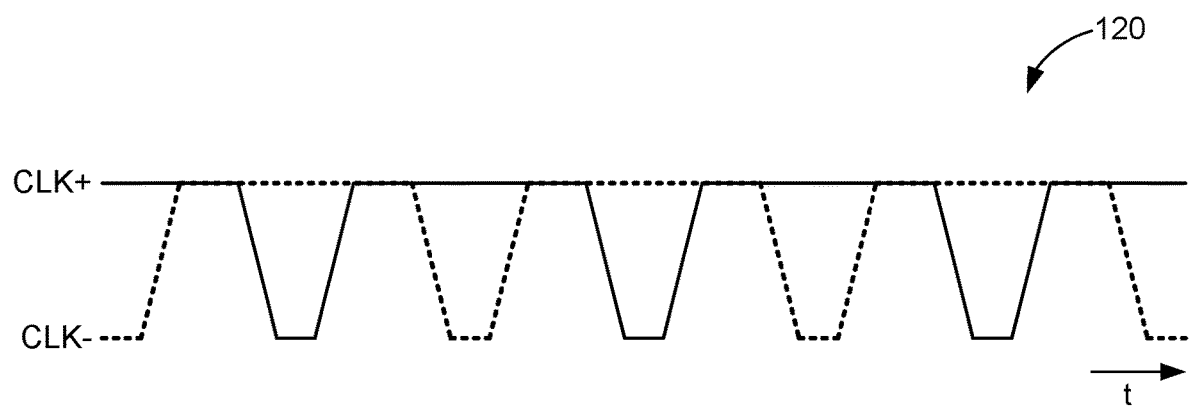
FIGS. 1B and 1C show example timing diagrams depicting non-complementary clock signals with non-ideal duty cycles.
Figure 1C:
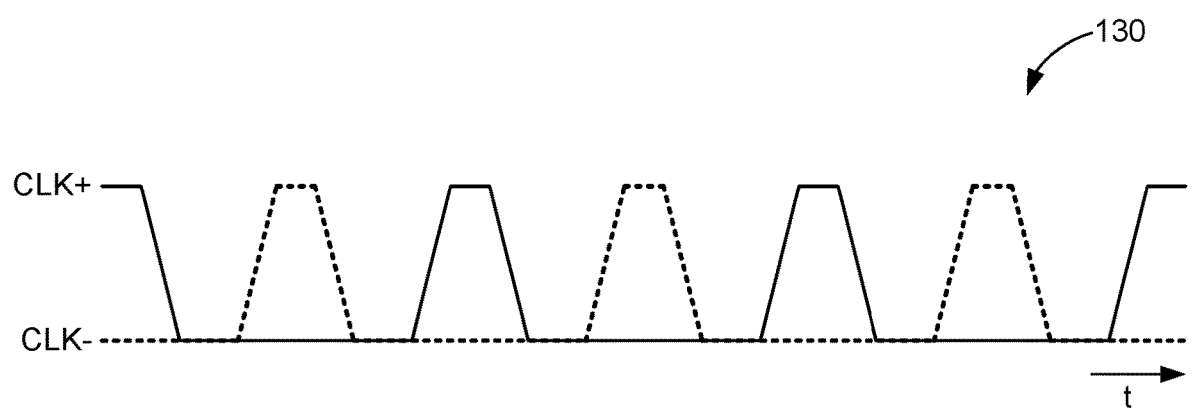

FIG. 1A shows an example timing diagram depicting an ideal differential clock signal 110. The clock signal 110 is formed from two component signals CLK+ and CLK− that are complementary in nature and have a 50% duty cycle. FIG. 1B shows an example timing diagram depicting a complementary clock signal 120 with a non-ideal duty cycle. The clock signal 120 is formed from two component signals CLK+ and CLK− that are not complementary in nature (e.g., CLK+ and CLK− may be in the logic-high state at the same time). Moreover, each of the component signals CLK+ and CLK− has a >50% duty cycle (e.g., CLK+ and CLK− each spends a greater percentage of time in the logic-high state than in the logic-low state). FIG. 1C shows an example timing diagram depicting another non-complementary clock signal 130 with a non-ideal duty cycle. The clock signal 130 is formed from two component signals CLK+ and CLK− that are not complementary in nature (e.g., CLK+ and CLK− may be in the logic-low state at the same time). Moreover, each of the component signals CLK+ and CLK− has a <50% duty cycle (e.g., CLK+ and CLK− each spends a greater percentage of time in the logic-low state than in the logic-high state).

As described above, changes in signaling levels (e.g., when converting from CML to CMOS logic) may cause non-idealities in a differential clock signal. In some instances, a received differential clock signal may have a non-ideal duty cycle (e.g., as shown in FIGS. 1B and 1C). In some other instances, a received differential clock signal may have non-complementary component signals (e.g., as shown in FIGS. 1B and 1C). Complementary clock signals are desirable to avoid short-circuit currents in differential circuits, while a 50% duty cycle is desirable to achieve accurate sampling in double-data rate (DDR) systems. Duty cycle distortion may cause deterministic jitter in DDR systems. Even in non-DDR circuits (e.g., which are triggered by only the rising edge of a clock signal), a 50% duty cycle may maximize operation speed, for example, in flip-flops comprising master-slave latches. Thus, it may be desirable to correct for non-idealities in differential clocks, for example, to achieve component signals that are complementary in nature and have a 50% duty cycle.

Aspects of the present disclosure may achieve differential clock signals that are complementary in nature with a desired duty cycle. In some embodiments, a duty-cycle adjustment circuit may generate an output signal based on a differential pair of input signals. More specifically, the duty-cycle adjustment circuit may drive the first output signal to a logic-high state based on transitions of a first polarity in a first component input signal of the differential pair, and may drive the first output signal to a logic-low state based on transitions of the first polarity in a second component input signal of the differential pair. In some aspects, transitions of the first polarity may correspond to rising edges of the corresponding component signal. Accordingly, rising-edge transitions of the first output signal may be aligned with rising-edge transitions of the first component input signal, and falling-edge transitions of the first output signal may be aligned with rising-edge transitions of the second component input signal. In other aspects, transitions of the first polarity may correspond to falling edges of the corresponding component input signal. Accordingly, rising-edge transitions of the first output signal may be aligned with falling-edge transitions of the first component input signal, and falling-edge transitions of the first output signal may be aligned with falling-edge transitions of the second component input signal.

In some embodiments, the first and second component input signals may be balanced (e.g., 180 degrees out of phase). For example, a rising (or falling) edge of the second component input signal may occur half a cycle before (or after) a corresponding rising (or falling) edge of the first component input signal. Aspects of the present disclosure recognize that, when the component signals are balanced, aligning the rising and falling edges of the first output signal with the rising (or falling) edges of the first and second component input signals, respectively, will cause the resulting first output signal to have a duty cycle that is substantially close to 50%. Accordingly, the duty-cycle adjustment circuit of the present embodiments may adjust the duty cycle of a received differential clock signal to a desired duty cycle using only the rising (or falling) edges of the received differential clock signal.

Figure 2:
FIG. 2 shows an example block diagram of a duty-cycle adjustment circuit for differential clock signals, in accordance with some embodiments.

FIG. 2 shows an example block diagram of a duty-cycle adjustment circuit 200 for differential clock signals, in accordance with some embodiments. The duty-cycle adjustment circuit 200 is configured to receive an input clock signal ($CLK_{IN}$) and generate an adjusted output clock signal ($CLK_{OUT}$) based on the input clock signal $CLK_{IN}$. In some aspects, the input clock signal $CLK_{IN}$ may be a differential clock signal. For example, the input clock signal $CLK_{IN}$ may comprise a differential pair of component (e.g., single-ended) signals.

In some embodiments, the duty-cycle adjustment circuit 200 may generate the output clock signal $CLK_{OUT}$ based on transitions of a first polarity (e.g., either rising-edge transitions or falling-edge transitions) in each of the component signals of the input clock signal $CLK_{IN}$. For example, the duty-cycle adjustment circuit 200 may drive the output clock signal $CLK_{OUT}$ to a logic-high state when one of the component signals of the input clock signal $CLK_{IN}$ transitions in a first direction (e.g., low-to-high or high-to-low), and may drive the output clock signal $CLK_{OUT}$ to a logic-low state when the other component signal of the input clock signal $CLK_{IN}$ transitions in the same (e.g., first) direction. Thus, the duty-cycle adjustment circuit 200 may ignore transitions of a second polarity (e.g., opposite the first polarity) in each of the component signals of the input clock signal $CLK_{IN}$.

In some aspects, the duty-cycle adjustment circuit 200 may drive the output clock signal $CLK_{OUT}$ to a logic-high state or a logic-low state based on the rising edges of the input clock signal $CLK_{IN}$ (e.g., while ignoring the falling edges of $CLK_{IN}$). For example, the duty-cycle adjustment circuit 200 may drive the output clock signal $CLK_{OUT}$ from the logic-low state to the logic-high state when a first component signal of the input clock signal $CLK_{IN}$ transitions from a logic-low state to a logic-high state, and may drive the output clock signal $CLK_{OUT}$ from the logic-high state to the logic-low state when a second component signal of the input clock signal $CLK_{IN}$ transitions from a logic-low state to a logic-high state. Accordingly, the rising-edges of the output clock signal $CLK_{OUT}$ will be aligned with the rising edges of the first component signal, and the falling edges of the output clock signal $CLK_{OUT}$ will be aligned with the rising edges of the second component signal.

In some other aspects, the duty-cycle adjustment circuit 200 may drive the output clock signal $CLK_{OUT}$ to a logic-high state or a logic-low state based on the falling edges of the input clock signal $CLK_{IN}$ (e.g., while ignoring the rising edges of $CLK_{IN}$). For example, the duty-cycle adjustment circuit 200 may drive the output clock signal $CLK_{OUT}$ from a logic-low state to a logic-high state when a first component signal of the input clock signal $CLK_{IN}$ transitions from a logic-high state to a logic-low state, and may drive the output clock signal $CLK_{OUT}$ from the logic-high state to the logic-low state when a second component signal of the input clock signal $CLK_{IN}$ transitions from a logic-high state to a logic-low state. Accordingly, the rising-edges of the output clock signal $CLK_{OUT}$ will be aligned with the falling edges of the first component signal, and the falling edges of the output clock signal $CLK_{OUT}$ will be aligned with the falling edges of the second component signal.

In some implementations, the duty-cycle adjustment circuit 200 may correct for non-idealities in the input clock signal $CLK_{IN}$. For example, changes in signaling levels may distort the input clock signal $CLK_{IN}$. As a result, the component signals of the input clock signal $CLK_{IN}$ may have a duty cycle that is greater than 50% (e.g., as shown in FIG. 1B) or less than 50% (e.g., as shown in FIG. 1C). However, the component signals are likely to remain balanced (e.g., 180 degrees out of phase) when the input clock signal $CLK_{IN}$ is generated using well-matched symmetric circuits. As described in greater detail below, when the component signals are balanced, the output clock signal $CLK_{OUT}$ generated by the duty-cycle adjustment circuit 200 will have a duty cycle that is substantially close to 50%.

Figure 3:
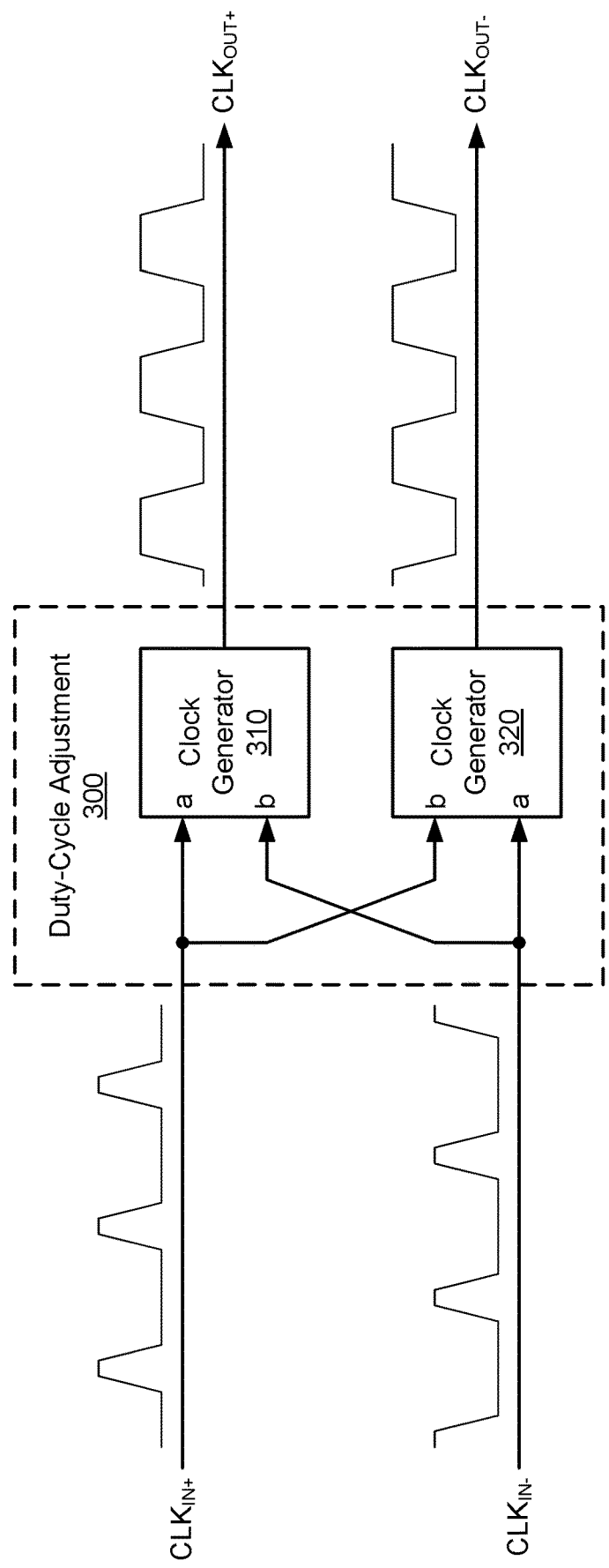
FIG. 3 shows an example block diagram of a duty-cycle adjustment circuit for differential clock signals, in accordance with some other embodiments.

FIG. 3 shows an example block diagram of a duty-cycle adjustment circuit 300 for differential clock signals, in accordance with some other embodiments. The duty-cycle adjustment circuit 300 may be an example embodiment of the duty-cycle adjustment circuit 200 of FIG. 2. For example, the duty-cycle adjustment circuit 300 may be configured to receive an input clock signal and generate an output clock signal based on the input clock signal. The input clock signal may comprise a differential pair of input signals ($CLK_{IN+}$ and $CLK_{IN-}$). The output clock signal may comprise a differential pair of output signals ($CLK_{OUT+}$ and $CLK_{OUT-}$).

In some embodiments, the duty-cycle adjustment circuit 300 may include a pair of clock generators 310 and 320. Each of the clock generators 310 and 320 is configured to generate a respective output signal $CLK_{OUT+}$ and $CLK_{OUT-}$ based on the pair of input signals $CLK_{IN+}$ and $CLK_{IN-}$. The first clock generator 310 may generate the first output signal $CLK_{OUT+}$ based on transitions of a first polarity (e.g., either rising-edge transitions or falling-edge transitions) in each of the input signals $CLK_{IN+}$ and $CLK_{IN-}$. For example, the first clock generator 310 may drive the first output signal $CLK_{OUT+}$ to a logic-high state when one of the input signals (e.g., $CLK_{IN+}$) transitions in a first direction (e.g., low-to-high or high-to-low), and may drive the first output signal $CLK_{OUT+}$ to a logic-low state when the other input signal (e.g., $CLK_{IN-}$) transitions in the first direction. The second clock generator 320 may generate the second output signal $CLK_{OUT-}$, to complement the first output signal $CLK_{OUT+}$, based on transitions of the first polarity in each of the input signals $CLK_{IN+}$ and $CLK_{IN-}$. Thus, the second clock generator 320 may drive the second output signal $CLK_{OUT-}$ to a logic-low state when one of the input signals (e.g., $CLK_{IN+}$) transitions in the first direction, and may drive the second output signal $CLK_{OUT-}$ to a logic-high state when the other input signal (e.g., $CLK_{IN-}$) transitions in the first direction.

Figure 4:
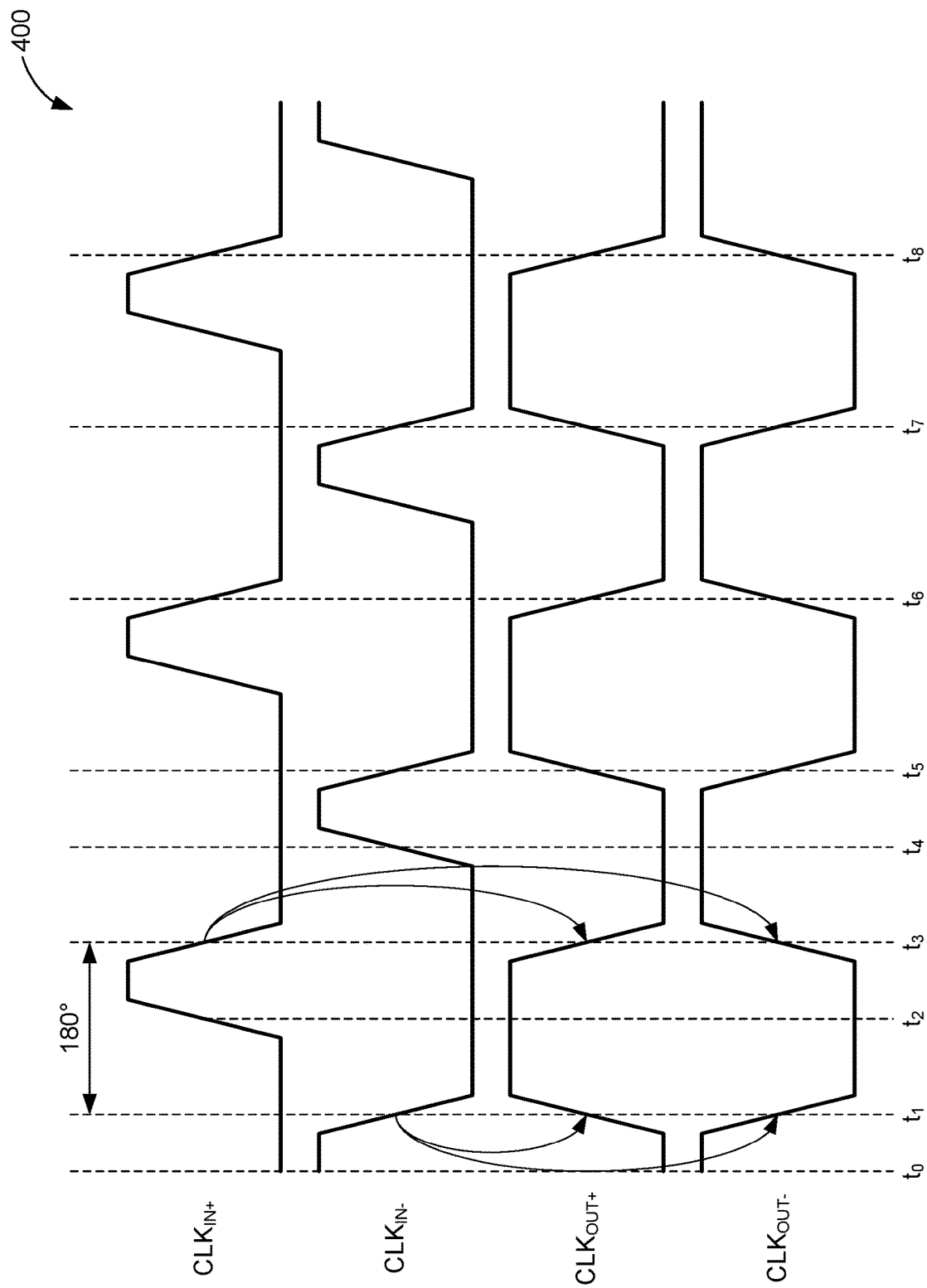
FIG. 4 shows a timing diagram depicting an example duty-cycle adjustment operation, in accordance with some embodiments.

FIG. 4 shows a timing diagram 400 depicting an example duty-cycle adjustment operation that may be performed by the duty-cycle adjustment circuit 300. As shown in FIG. 4, the input signals $CLK_{IN+}$ and $CLK_{IN-}$ may represent component signals of a differential input clock, and the output signals $CLK_{OUT+}$ and $CLK_{OUT-}$ may represent component signals of a differential output clock. In the example of FIG. 4, the input signals $CLK_{IN+}$ and $CLK_{IN-}$ are not complementary in nature. For example, there may be times when the input signals $CLK_{IN+}$ and $CLK_{IN-}$ are both in the logic-low state (e.g., between times $t_1$ and $t_2$). Furthermore, each of the input clock signals $CLK_{IN+}$ and $CLK_{IN-}$ has a <50% duty cycle. For example, each of the input signals $CLK_{IN+}$ and $CLK_{IN-}$ may be in the logic-high state (e.g., between times $t_2$ to $t_3$) for less than 50% of a clock cycle (e.g., between times $t_1$ to $t_5$). However, in the example of FIG. 4, the input signals $CLK_{IN+}$ and $CLK_{IN-}$ are balanced. For example, the falling edges of the first input signal $CLK_{IN+}$ (e.g., at times $t_3$, $t_6$, and $t_8$) trail the falling edges of the second input signal $CLK_{IN-}$ (e.g., at times $t_1$, $t_5$, and $t_7$, respectively) by half a clock cycle. Thus, the input signals $CLK_{IN+}$ and $CLK_{IN-}$ are 180° degrees out of phase.

As described above, the first clock generator 310 may generate the first output signal $CLK_{OUT+}$ based on transitions of a first polarity in the input signals $CLK_{IN+}$ and $CLK_{IN-}$. In the example of FIG. 4, the first clock generator 310 is configured to drive the first output signal $CLK_{OUT+}$ to a logic-low state or a logic-high state based on falling-edge transitions of the input signals $CLK_{IN+}$ and $CLK_{IN-}$ respectively. For example, the first clock generator 310 may drive the first output signal $CLK_{OUT+}$ from the logic-low state to the logic-high state when the second input signal $CLK_{IN-}$ transitions from a logic-high state to a logic-low state (e.g., at times $t_1$, $t_5$, and $t_7$). Further, the first clock generator 310 may drive the first output signal $CLK_{OUT+}$ from the logic-high state to the logic-low state when the first input signal $CLK_{IN+}$ transitions from a logic-high state to a logic-low state (e.g., at times $t_3$, $t_6$, and $t_8$).

The second clock generator 320 may generate the second output signal $CLK_{OUT-}$, to complement the first output signal $CLK_{OUT+}$, based on transitions of the first polarity in the input signals $CLK_{IN+}$ and $CLK_{IN-}$. Thus, the second clock generator 320 is configured to drive the second output signal $CLK_{OUT-}$ to a logic state opposite that of the first output signal $CLK_{OUT+}$ based on the falling-edge transitions of the input signals $CLK_{IN+}$ and $CLK_{IN-}$. For example, the second clock generator 320 may drive the second output signal $CLK_{OUT-}$ from the logic-high state to the logic-low state when the second input signal $CLK_{IN-}$ transitions from the logic-high state to the logic-low state (e.g., at time $t_1$, $t_5$, and $t_7$). Further, the second clock generator 320 may drive the second output signal $CLK_{OUT-}$ from the logic-low state to the logic-high state when the first input signal $CLK_{IN+}$ transitions from the logic-high state to the logic-low state (e.g., at time $t_3$, $t_6$, and $t_8$).

As shown in FIG. 4, the output signals $CLK_{OUT+}$ and $CLK_{OUT-}$ are complementary in nature and have a 50% duty cycle. Thus, the duty-cycle adjustment circuit 300 may correct for non-idealities in the input signals $CLK_{IN+}$ and $CLK_{IN-}$ when generating the output signals $CLK_{OUT+}$ and $CLK_{OUT-}$ based on only the falling-edge transitions of each of the input signals $CLK_{IN+}$ and $CLK_{IN-}$. Accordingly, aspects of the present disclosure may provide accurate duty-cycle correction with relatively low power and/or hardware complexity.

In the example of FIG. 4, the duty-cycle adjustment circuit 300 is configured to generate the output signals $CLK_{OUT+}$ and $CLK_{OUT-}$ based on falling-edge transitions of the input signals $CLK_{IN+}$ and $CLK_{IN-}$. However, it is evident from FIG. 4 that the duty-cycle adjustment circuit 300 can achieve substantially similar results based on rising-edge transitions of the input signals $CLK_{IN+}$ and $CLK_{IN-}$ and/or other input signals with different duty cycles (such as the clock signal 120 of FIG. 1B). For example, in some other embodiments, the duty-cycle adjustment circuit 300 may be configured to generate a differential output clock signal with complementary component signals and a 50% duty cycle by aligning the rising and falling edges of the output signals $CLK_{OUT+}$ and $CLK_{OUT-}$ with the rising edges of the input signals $CLK_{IN+}$ and $CLK_{IN-}$.

Figure 5:
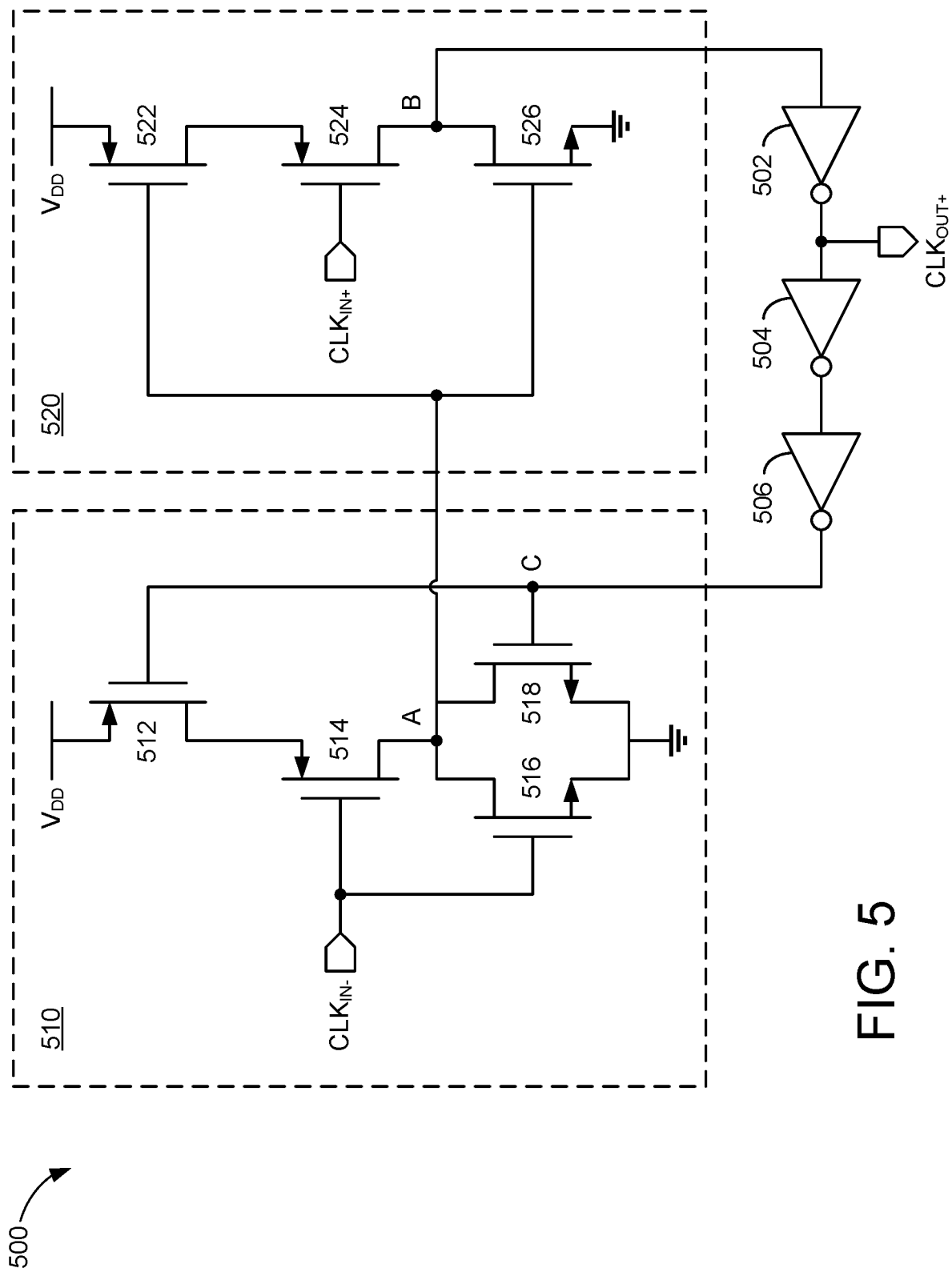
FIG. 5 shows an example circuit diagram of a clock generator for a duty-cycle adjustment circuit, in accordance with some embodiments.

FIG. 5 shows an example circuit diagram of a clock generator 500 for a duty-cycle adjustment circuit, in accordance with some embodiments. The clock generator 500 may be an example embodiment of the first clock generator 310 of the duty-cycle adjustment circuit 300 of FIG. 3. For example, the clock generator 500 may be configured to receive a differential pair of input signals ($CLK_{IN+}$ and $CLK_{IN-}$) and generate an output signal ($CLK_{OUT+}$) based on the input signals $CLK_{IN+}$ and $CLK_{IN-}$. In some aspects, the output signal $CLK_{OUT+}$ may correspond to a single-ended clock signal. In some other aspects, the output signal $CLK_{OUT+}$ may be a component signal of a differential clock signal.

In some embodiments, the clock generator 500 may include pull-up circuitry 510, pull-down circuitry 520, and a series of delay stages 502-506. The pull-up circuitry 510 is configured to drive the output signal $CLK_{OUT+}$ to a logic-high state based on transitions of a first polarity (e.g., falling-edge transitions) in the second input signal $CLK_{IN-}$. The pull-down circuitry 520 is configured to drive the output signal $CLK_{OUT+}$ to a logic-low state based on transitions of the first polarity (e.g., falling-edge transitions) in the first input signal $CLK_{IN+}$. The delay stages 502-506 control a timing of the pull-up circuitry 510 in relation to the pull-down circuitry 520 based, at least in part, on a timing of the transitions in the input signals $CLK_{IN+}$ and $CLK_{IN-}$. For example, the delay stages 502-506 may ensure that the pull-down circuitry 520 does not attempt to drive the output signal $CLK_{OUT+}$ to the logic-low state at the same time the pull-up circuitry 510 is attempting to drive the output signal $CLK_{OUT+}$ to the logic-high state.

The pull-up circuitry 510 includes two P-type metal-oxide-semiconductor (PMOS) transistors 512 and 514 coupled in series and two N-type metal-oxide-semiconductor (NMOS) transistors 516 and 518 coupled in parallel. As shown in FIG. 5, the source of the first PMOS transistor 512 is coupled to a voltage supply or rail ($V_{DD}$), and the drain of the first PMOS transistor 512 is coupled to the source of the second PMOS transistor 514. The drain of the second PMOS transistor 514 is coupled to the drains of the NMOS transistors 516 and 518 (e.g., at node A), and the sources of the NMOS transistors 516 and 518 are coupled to a low voltage potential (e.g., ground). The gates of transistors 514 and 516 are coupled to an input that receives the second input signal $CLK_{IN-}$, and the gates of transistors 512 and 518 are coupled to an output of delay stage 506 (e.g., at node C).

The pull-down circuitry 520 includes two PMOS transistors 522 and 524 and an NMOS transistor 526 coupled in series. As shown in FIG. 5, the source of the first PMOS transistor 522 is coupled to the voltage supply $V_{DD}$, and the drain of the first PMOS transistor 522 is coupled to the source of the second PMOS transistor 524. The drain of the second PMOS transistor 524 is coupled to the drain of the NMOS transistor 526, which is further coupled to an input of delay stage 502 (e.g., at node B), and the source of the NMOS transistor 526 is coupled to a low voltage potential (e.g., ground). The gate of the second PMOS transistor 524 is coupled to an input that receives the first input signal $CLK_{IN+}$, and the gates of transistors 522 and 526 are coupled to node A.

With reference for example to FIG. 4, the clock generator 500 may operate in a first state, from times $t_0$ to $t_1$, where the output signal $CLK_{OUT+}$ settles in the logic-low state. During this time, the voltage at node C is also low, causing transistor 512 to be on and transistor 518 to be off. The first input signal $CLK_{IN+}$ is low, at time $t_0$, causing transistor 524 to be on. The second input signal $CLK_{IN-}$ is high, at time $t_0$, causing transistor 514 to be off and transistor 516 to be on. Since transistor 516 is on and transistor 514 is off, the voltage at node A is pulled low (e.g., to ground), causing transistor 522 to be on and transistor 526 to be off. Since transistors 522 and 524 are both on (and transistor 526 is off), the voltage at node B is pulled high (e.g., to $V_{DD}$). The voltage at node B is inverted via the delay stage 502 to drive (or maintain) the output signal $CLK_{OUT+}$ in the logic-low state.

At time $t_1$, the second input signal $CLK_{IN-}$ transitions to the logic-low state, causing transistor 514 to turn on and transistor 516 to turn off. At this time, the voltage at node C has not yet changed (e.g., remains low). Thus, transistor 512 remains on and transistor 518 remains off. Since transistors 512 and 514 are both on (and transistors 516 and 518 are both off), the voltage at node A is pulled high (e.g., to $V_{DD}$), causing transistor 522 to turn off and transistor 526 to turn on. The first input signal $CLK_{IN+}$ remains in the logic-low state, at time $t_1$, causing transistor 524 to remain on. However, because transistor 522 is now off and transistor 526 is now on, the voltage at node B is pulled low (e.g., to ground). The voltage at node B is inverted via the delay stage 502 to drive the output signal $CLK_{OUT+}$ to the logic-high state. In this manner, rising-edge transitions of the output signal $CLK_{OUT+}$ are aligned with falling-edge transitions of the second input signal $CLK_{IN-}$.

At time $t_2$, the first input signal $CLK_{IN+}$ transitions to the logic-high state, causing transistor 524 to turn off. At this time, the voltage at node C is still low (e.g., due to delay stages 504 and 506), causing transistor 512 to remain on and transistor 518 to remain off. In some embodiments, the delay stages 504 and 506 may be configured to delay the change in voltage at node C for approximately half a period or clock cycle (e.g., after the next falling-edge transition, but before the next rising-edge transition, of the first input signal $CLK_{IN+}$). Thus, the voltage at node C will not reflect the change in voltage at the output of the clock generator 500 (e.g., $CLK_{OUT+}$) until at least time $t_2$. However, the change in voltage at the output of the clock generator 500 will be reflected at node C by or before time $t_3$. The second input signal $CLK_{IN-}$ remains in the logic-low state, at time $t_2$, causing transistor 514 to remain on and transistor 516 to remain off. Since transistors 512 and 514 are both on (and transistors 516 and 518 are both off), the voltage at node A remains high, causing transistor 522 to remain off and transistor 526 to remain on. While transistor 522 is off and transistor 526 is on, the voltage at node B will remain low. In this manner, the pull-up circuitry 510 holds or maintains the output signal $CLK_{OUT+}$ in the logic-high state during rising-edge transitions of the first input signal $CLK_{IN+}$.

Eventually, the voltage at node C will reflect the voltage at the output of the clock generator 500 (e.g., between times $t_2$ and $t_3$). When the voltage at node C is pulled high (e.g., to reflect the logic-high state of the output signal $CLK_{OUT+}$), transistor 512 is turned off and transistor 518 is turned on, causing the voltage at node A to be pulled low. The low voltage at node A causes transistor 522 to turn on and transistor 526 to turn off. However, because transistor 524 remains off (e.g., from times $t_2$ to $t_3$), the voltage at node B does not change (e.g., remains low). Thus, the output signal $CLK_{OUT+}$ remains in the logic-high state.

At time $t_3$, the first input signal $CLK_{IN+}$ transitions to the logic-low state, causing transistor 524 to turn on. The second input signal $CLK_{IN-}$ remains in the logic-low state, at time $t_3$, causing transistor 514 to remain on and transistor 516 to remain off. However, the voltage at node C has not yet changed (e.g., remains high), causing transistor 512 to remain off and transistor 518 to remain on. As a result, the voltage at node A remains low, causing transistor 522 to remain on and transistor 526 to remain off. Since transistors 522 and 524 are both on (and transistor 526 is off), the voltage at node B is pulled high (e.g., to $V_{DD}$). The voltage at node B is inverted via the delay stage 502 to drive the output signal $CLK_{OUT+}$ to the logic-low state. In this manner, falling-edge transitions of the output signal $CLK_{OUT+}$ are aligned with falling-edge transitions of the first input signal $CLK_{IN-}$.

At time $t_4$, the second input signal $CLK_{IN-}$ transitions to the logic-high state, causing transistor 514 to turn off and transistor 516 to turn on. At this time, the voltage at node C is still high (e.g., due to delay stages 504 and 506), causing transistor 512 to remain off and transistor 518 to remain on. As described above, the delay stages 504 and 506 may be configured to delay the change in voltage at node C for approximately half a period or clock cycle (e.g., after the next rising-edge transition, but before the next falling-edge transition, of the second input signal $CLK_{IN-}$). Thus, the voltage at node C will not reflect the change in voltage at the output of the clock generator 500 (e.g., $CLK_{OUT+}$) until at least time $t_4$. However, the change in voltage at the output of the clock generator 500 will be reflected at node C by or before time $t_5$. The first input signal $CLK_{IN+}$ remains in the logic-low state, at time $t_4$, causing transistor 524 to remain on. Since transistor 512 is off and transistor 518 is on, the voltage at node A remains low, causing transistor 522 to remain on and transistor 526 to remain off. While transistors 522 and 524 are both on (and transistor 526 is off), the voltage at node B will remain high. In this manner, the pull-down circuitry 520 holds or maintains the output signal $CLK_{OUT+}$ in the logic-low state during rising-edge transitions of the second input signal $CLK_{IN-}$.

Eventually, the voltage at node C will reflect the voltage at the output of the clock generator 500 (e.g., between times $t_4$ and $t_5$). When the voltage at node C is pulled low (e.g., to reflect the logic-low state of the output signal $CLK_{OUT+}$), transistor 512 is turned on and transistor 518 is turned off. However, because transistor 514 remains off (e.g., from times $t_4$ to $t_5$), the voltage at node A does not change (e.g., remains low), causing transistor 522 to remain on and transistor 526 to remain off. Since transistors 522 and 524 remain on (and transistor 526 remains off), the output signal $CLK_{OUT+}$ remains in the logic-low state. It is noted that, at this time (e.g., between times $t_4$ and $t_5$), the state of the clock generator 500 will have returned to the state it was in at time $t_0$. Thus, the operation described above (e.g., from times $t_1$ to $t_5$) may be repeated to generate each rising-edge and falling-edge transition of the output signal $CLK_{OUT+}$. For simplicity, the various states of the clock generator 500 are summarized below, in Table 1.

TABLE 1

| CLK$_{IN+}$ | CLK$_{IN-}$ | A | B | C | CLK$_{OUT+}$ |
|---|---|---|---|---|---|
| 0 | 1 | 0 | 1 | 0 | 0 |
| 0 | 0 | 1 | 0 | 0 | 1 |
| 1 | 0 | 1 | 0 | 0 | 1 |
| 1 | 0 | 0 | 0 | 1 | 1 |
| 0 | 0 | 0 | 1 | 1 | 0 |
| 0 | 1 | 0 | 1 | 1 | 0 |
| 0 | 1 | 0 | 1 | 0 | 0 |

It is noted that the clock generator 500 of FIG. 5 illustrates a particular embodiment of the clock generator 310 of FIG. 3. However, in actual implementations, the configuration of transistors within the clock generator 500 may vary from what is shown in FIG. 5 without deviating from the scope of the disclosure. For example, in some implementations, one or more PMOS transistors may be substituted for NMOS transistors or other circuitry configured to implement logic similar to what is described above with respect to FIGS. 3-5. In some other implementations, one or more NMOS transistors may be substituted for PMOS transistors or other circuitry configured to implement logic similar to what is described above with respect to FIGS. 3-5. Still further, in some implementations, the clock generator 500 may be configured to generate the output signal CLK$_{OUT+}$ based on rising-edge transitions of the input signals CLK$_{IN+}$ and CLK$_{IN-}$.

Figure 6:
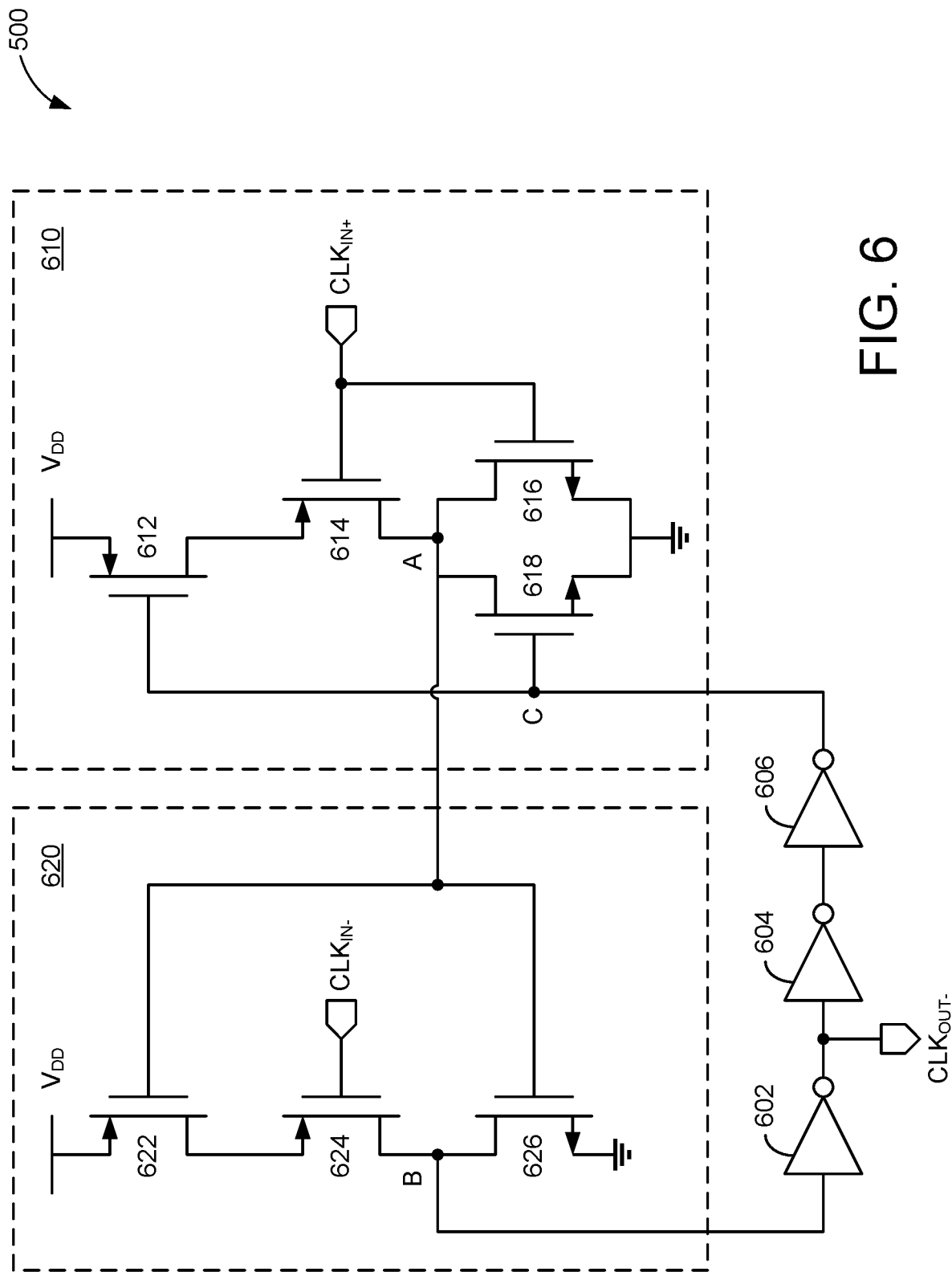
FIG. 6 shows an example circuit diagram of a clock generator for a duty-cycle adjustment circuit, in accordance with some other embodiments.

FIG. 6 shows an example circuit diagram of a clock generator 600 for a duty-cycle adjustment circuit, in accordance with some other embodiments. The clock generator 600 may be an example embodiment of the second clock generator 320 of the duty-cycle adjustment circuit 300 of FIG. 3. For example, the clock generator 600 may be configured to receive a differential pair of input signals (CLK$_{IN+}$ and CLK$_{IN-}$) and generate an output signal (CLK$_{OUT-}$) based on the input signals CLK$_{IN+}$ and CLK$_{IN-}$. In some aspects, the output signal CLK$_{OUT-}$ may correspond to a single-ended clock signal. In some other aspects, the output signal CLK$_{OUT-}$ may be a component signal of a differential clock signal (e.g., CLK$_{OUT-}$ may be complementary to CLK$_{OUT+}$).

In some embodiments, the clock generator 600 may include pull-up circuitry 610, pull-down circuitry 620, and a series of delay stages 602-606. The pull-up circuitry 610 is configured to drive the output signal CLK$_{OUT-}$ to a logic-high state based on transitions of a first polarity (e.g., falling-edge transitions) in the first input signal CLK$_{IN+}$. The pull-down circuitry 620 is configured to drive the output signal CLK$_{OUT-}$ to a logic-low state based on transitions of the first polarity (e.g., falling-edge transitions) in the second input signal CLK$_{IN-}$. The delay stages 602-606 control a timing of the pull-up circuitry 610 in relation to the pull-down circuitry 620 based, at least in part, on a timing of the transitions in the input signals CLK$_{IN+}$ and CLK$_{IN-}$. For example, the delay stages 602-606 may ensure that the pull-down circuitry 620 does not attempt to drive the output signal CLK$_{OUT-}$ to the logic-low state at the same time the pull-up circuitry 610 is attempting to drive the output signal CLK$_{OUT-}$ to the logic-high state.

The pull-up circuitry 610 includes two PMOS transistors 612 and 614 coupled in series and two NMOS transistors 616 and 618 coupled in parallel. As shown in FIG. 6, the source of the first PMOS transistor 612 is coupled to a voltage supply or rail (V$_{DD}$), and the drain of the first PMOS transistor 612 is coupled to the source of the second PMOS transistor 614. The drain of the second PMOS transistor 614 is coupled to the drains of the NMOS transistors 616 and 618 (e.g., at node A), and the sources of the NMOS transistors 616 and 618 are coupled to a low voltage potential (e.g., ground). The gates of transistors 614 and 616 are coupled to an input that receives the first input signal CLK$_{IN+}$, and the gates of transistors 612 and 618 are coupled to an output of delay stage 606 (e.g., at node C).

The pull-down circuitry 620 includes two PMOS transistors 622 and 624 and an NMOS transistor 626 coupled in series. As shown in FIG. 6, the source of the first PMOS transistor 622 is coupled to the voltage supply V$_{DD}$, and the drain of the first PMOS transistor 622 is coupled to the source of the second PMOS transistor 624. The drain of the second PMOS transistor 624 is coupled to the drain of the NMOS transistor 626, which is further coupled to an input of delay stage 602 (e.g., at node B), and the source of the NMOS transistor 626 is coupled to a low voltage potential (e.g., ground). The gate of the second PMOS transistor 624 is coupled to an input that receives the second input signal CLK$_{IN-}$, and the gates of transistors 622 and 626 are coupled to node A.

With reference for example to FIG. 4, the clock generator 600 may operate in a first state, from times t$_0$ to t$_1$, where the output signal CLK$_{OUT-}$ settles in the logic-high state. During this time, the voltage at node C is also high, causing transistor 612 to be off and transistor 618 to be on. The first input signal CLK$_{IN+}$ is low, at time t$_0$, causing transistor 614 to be on and transistor 616 to be off. The second input signal CLK$_{IN-}$ is high, at time t$_0$, causing transistor 624 to be off. Since transistor 618 is on and transistor 612 is off, the voltage at node A is pulled low (e.g., to ground), causing transistor 622 to be on and transistor 628 to be off. However, since transistor 624 is also off, the voltage at node B is held in its current state (e.g., low). The voltage at node B is inverted via the delay stage 602 to drive (or maintain) the output signal CLK$_{OUT-}$ in the logic-high state.

At time t$_1$, the second input signal CLK$_{IN-}$ transitions to the logic-low state, causing transistor 624 to turn on. The first input signal CLK$_{IN+}$ remains in the logic-low state, at time t$_1$, causing transistor 614 to remain on and transistor 616 to remain off. At this time, the voltage at node C has not yet changed (e.g., remains high). Thus, transistor 612 remains off and transistor 618 remains on, causing the voltage at node A to remain low. As a result, transistor 622 remains on and transistor 626 remains off. Since transistors 622 and 624 are both on (and transistor 626 is off), the voltage at node B is pulled high (e.g., to V$_{DD}$). The voltage at node B is inverted via the delay stage 602 to drive the output signal CLK$_{OUT-}$ to the logic-low state. In this manner, falling-edge transitions of the output signal CLK$_{OUT-}$ are aligned with falling-edge transitions of the second input signal CLK$_{IN-}$.

At time t$_2$, the first input signal CLK$_{IN+}$ transitions to the logic-high state, causing transistor 614 to turn off and transistor 616 to turn on. At this time, the voltage at node C is still high (e.g., due to delay stages 604 and 606), causing transistor 612 to remain off and transistor 618 to remain on. In some embodiments, the delay stages 604 and 606 may be configured to delay the change in voltage at node C for approximately half a period or clock cycle (e.g., after the next rising-edge transition, but before the next falling-edge transition, of the first input signal CLK$_{IN+}$). Thus, the voltage at node C will not reflect the change in voltage at the output of the clock generator 600 (e.g., CLK$_{OUT-}$) until at least time t$_2$. However, the change in voltage at the output of the clock generator 600 will be reflected at node C by or before time t$_3$. The second input signal CLK$_{IN-}$ remains in the logic-low state, at time $t_2$, causing transistor 624 to remain on. Since transistor 612 is off and transistor 618 is on, the voltage at node A remains low, causing transistor 622 to remain on and transistor 626 to remain off. While transistors 622 and 624 are both on (and transistor 626 is off), the voltage at node B will remain high. In this manner, the pull-down circuitry 620 holds or maintains the output signal $CLK_{OUT-}$ in the logic-low state during rising-edge transitions of the first input signal $CLK_{IN+}$.

Eventually, the voltage at node C will reflect the voltage at the output of the clock generator 600 (e.g., between times $t_2$ and $t_3$). When the voltage at node C is pulled low (e.g., to reflect the logic-low state of the output signal $CLK_{OUT-}$), transistor 612 is turned on and transistor 618 is turned off. However, because transistor 614 remains off (e.g., from times $t_2$ to $t_3$), the voltage at node A does not change (e.g., remains low), causing transistor 622 to remain on and transistor 626 to remain off. Since transistors 622 and 624 remain on (and transistor 626 remains off), the output signal $CLK_{OUT-}$ remains in the logic-low state.

At time $t_3$, the first input signal $CLK_{IN+}$ transitions to the logic-low state, causing transistor 614 to turn on and transistor 616 to turn off. At this time, the voltage at node C has not yet changed (e.g., remains low). Thus, transistor 612 remains on and transistor 618 remains off. Since transistors 612 and 614 are both on (and transistors 616 and 618 are both off), the voltage at node A is pulled high (e.g., to $V_{DD}$), causing transistor 622 to turn off and transistor 626 to turn on. The second input signal $CLK_{IN-}$ remains in the logic-low state, at time $t_3$, causing transistor 624 to remain on. However, because transistor 622 is now off and transistor 626 is now on, the voltage at node B is pulled low (e.g., to ground). The voltage at node B is inverted via the delay stage 602 to drive the output signal $CLK_{OUT-}$ to the logic-high state. In this manner, rising-edge transitions of the output signal $CLK_{OUT-}$ are aligned with falling-edge transitions of the first input signal $CLK_{IN+}$.

At time $t_4$, the second input signal $CLK_{IN-}$ transitions to the logic-high state, causing transistor 624 to turn off. At this time, the voltage at node C is still low (e.g., due to delay stages 604 and 606), causing transistor 612 to remain on and transistor 618 to remain off. As described above, the delay stages 604 and 606 may be configured to delay the change in voltage at node C for approximately half a period or clock cycle (e.g., after the next rising-edge transition, but before the next-falling edge transition, of the second input signal $CLK_{IN-}$). Thus, the voltage at node C will not reflect the change in voltage at the output of the clock generator 600 (e.g., $CLK_{OUT-}$) until at least time $t_4$. However, the change in voltage at the output of the clock generator 600 will be reflected at node C by or before time $t_5$. The first input signal $CLK_{IN+}$ remains in the logic-low state, at time $t_5$, causing transistor 614 to remain on and transistor 616 to remain off. Since transistors 612 and 614 are both on (and transistors 616 and 618 are both off), the voltage at node A remains high, causing transistor 622 to remain off and transistor 626 to remain on. While transistor 622 is off and transistor 626 is on, the voltage at node B will remain low. In this manner, the pull-up circuitry 610 holds or maintains the output signal $CLK_{OUT-}$ in the logic-high state during rising-edge transitions of the second input signal $CLK_{IN-}$.

Eventually, the voltage at node C will reflect the voltage at the output of the clock generator 600 (e.g., between times $t_4$ and $t_5$). When the voltage at node C is pulled high (e.g., to reflect the logic-high state of the output signal $CLK_{OUT-}$), transistor 612 is turn off and transistor 618 is turned on, causing the voltage at node A to be pulled low. The low voltage at node A causes transistor 622 to turn on and transistor 626 to turn off. However, because transistor 624 remains off (e.g., from times $t_4$ to $t_5$), the voltage at node B does not change (e.g., remains low). Thus, the output signal $CLK_{OUT-}$ remains in the logic-high state. It is noted that, at this time (e.g., between times $t_4$ and $t_5$), the state of the clock generator 600 will have returned to the state it was in at time $t_0$. Thus, the operation described above (e.g., from times $t_1$ to $t_5$) may be repeated to generate each rising-edge and falling-edge transition of the output signal $CLK_{OUT-}$. For simplicity, the various states of the clock generator 600 are summarized below, in Table 2.

TABLE 2

| $CLK_{IN+}$ | $CLK_{IN-}$ | A | B | C | $CLK_{OUT-}$ |
|---|---|---|---|---|---|
| 0 | 1 | 0 | 0 | 1 | 1 |
| 0 | 0 | 0 | 1 | 1 | 0 |
| 1 | 0 | 0 | 1 | 1 | 0 |
| 1 | 0 | 0 | 1 | 0 | 0 |
| 0 | 0 | 1 | 0 | 0 | 1 |
| 0 | 1 | 1 | 0 | 0 | 1 |
| 0 | 1 | 0 | 0 | 1 | 1 |

It is noted that the clock generator 600 of FIG. 6 illustrates a particular embodiment of the clock generator 320 of FIG. 3. However, in actual implementations, the configuration of transistors within the clock generator 600 may vary from what is shown in FIG. 6 without deviating from the scope of the disclosure. For example, in some implementations, one or more PMOS transistors may be substituted for NMOS transistors or other circuitry configured to implement logic similar to what is described above with respect to FIGS. 3, 4, and 6. In some other implementations, one or more NMOS transistors may be substituted for PMOS transistors or other circuitry configured to implement logic similar to what is described above with respect to FIGS. 3, 4, and 6. Still further, in some implementations, the clock generator 600 may be configured to generate the output signal $CLK_{OUT-}$ based on rising-edge transitions of the input signals $CLK_{IN+}$ and $CLK_{IN-}$.

Figure 7:
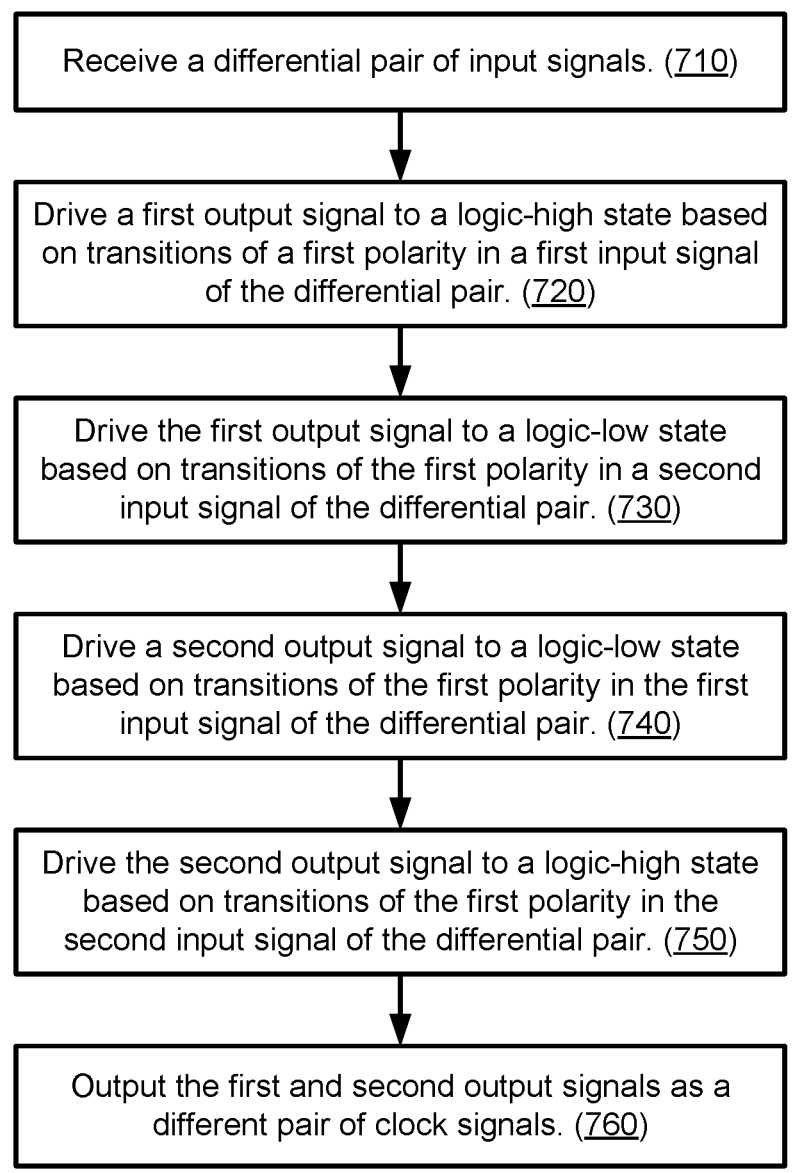
FIG. 7 is an illustrative flow chart depicting an example operation for adjusting the duty cycle of a differential clock signal, in accordance with some embodiments.

FIG. 7 is an illustrative flow chart depicting an example operation 700 for adjusting the duty cycle of a differential clock signal, in accordance with some embodiments. Although described below with respect to the duty-cycle adjustment circuit 300 of FIG. 3, the example operation 700 may be performed by any suitable duty-cycle adjustment circuit.

The duty-cycle adjustment circuit 300 receives a differential pair of an input signals (710). For example, the differential pair of input signals may include a pair of component signals ($CLK_{IN+}$ and $CLK_{IN-}$) corresponding to a differential clock. In some aspects, the component signals $CLK_{IN+}$ and $CLK_{IN-}$ may not be complementary in nature (e.g., as shown in FIGS. 1B and 1C). Furthermore, the component signals $CLK_{IN+}$ and/or $CLK_{IN-}$ may have a duty cycle that is greater than 50% (e.g., as shown in FIG. 1B) or less than 50% (e.g., as shown in FIG. 1C). However, in some aspects, the component signals $CLK_{IN+}$ and $CLK_{IN-}$ may be balanced (e.g., 180 degrees out of phase).

The duty-cycle adjustment circuit 300 drives a first output signal to a logic-high state based on transitions of a first polarity in a first input signal of the differential pair (720). For example, the first clock generator 310 may generate the first output signal $CLK_{OUT+}$ based on either rising-edge transitions or falling-edge transitions in each of the input signals $CLK_{IN+}$ and $CLK_{IN-}$. In some embodiments, the first clock generator 310 may drive the first output signal $CLK_{OUT+}$ to the logic-high state when the first input signal $CLK_{IN+}$ transitions in a first direction (e.g., low-to-high or high-to-low). In some aspects, the first clock generator 310 may further prevent the first output signal $CLK_{OUT+}$ from changing states when the first input signal $CLK_{IN+}$ transitions in a second direction (e.g., opposite the first direction).

The duty-cycle adjustment circuit 300 drives the first output signal to a logic-low state based on transitions of the first polarity in a second input signal of the differential pair (730). As described above, the first clock generator 310 may generate the first output signal $CLK_{OUT+}$ based on either rising-edge transitions or falling-edge transitions in each of the input signals $CLK_{IN+}$ and $CLK_{IN-}$. In some embodiments, the first clock generator 310 may drive the first output signal $CLK_{OUT+}$ to the logic-low state when the second input signal $CLK_{IN-}$ transitions in the first direction. In some aspects, the first clock generator 310 may further prevent the first output signal $CLK_{OUT+}$ from changing states when the second input signal $CLK_{IN-}$ transitions in the second direction.

The duty-cycle adjustment circuit 300 drives a second output signal to a logic-low state based on transitions of the first polarity in the first input signal of the differential pair (740). For example, the second clock generator 320 may generate the second output signal $CLK_{OUT-}$, to complement the first output signal $CLK_{OUT+}$, based on transitions of the first polarity in each of the input signals $CLK_{IN+}$ and $CLK_{IN-}$. In some embodiments, the second clock generator 320 may drive the second output signal $CLK_{OUT-}$ to the logic-low state when the first input signal $CLK_{IN+}$ transitions in the first direction. In some aspects, the second clock generator 320 may further prevent the second output signal $CLK_{OUT-}$ from changing states when the first input signal $CLK_{IN+}$ transitions in the second direction.

The duty-cycle adjustment circuit 300 drives the second output signal to a logic-high state based on transitions of the first polarity in the second input signal of the differential pair (750). As described above, the second clock generator 320 may generate the second output signal $CLK_{OUT-}$ based on transitions of the first polarity in each of the input signals $CLK_{IN+}$ and $CLK_{IN-}$. In some embodiments, the second clock generator 320 may drive the second output signal $CLK_{OUT-}$ to the logic-high state when the second input signal $CLK_{IN-}$ transitions in the first direction. In some aspects, the second clock generator 320 may further prevent the second output signal $CLK_{OUT-}$ from changing states when the second input signal $CLK_{IN-}$ transitions in the second direction.

The duty-cycle adjustment circuit 300 may output the first and second output signals as a differential pair of clock signals (760). In some embodiments, the differential pair of clock signals output by the duty-cycle adjustment circuit 300 may correct for non-idealities in the received input signals. For example, by aligning the rising and falling edges of the output signals $CLK_{OUT+}$ and $CLK_{OUT-}$ with only the rising (or falling) edges of the input signals $CLK_{IN+}$ and $CLK_{IN-}$, the duty-cycle adjustment circuit 300 may produce output signals $CLK_{OUT+}$ $CLK_{OUT-}$ that are complementary in nature (e.g., as shown in FIG. 4). Further, when the input signals $CLK_{IN+}$ and $CLK_{IN-}$ are balanced, the output signals $CLK_{OUT+}$ and $CLK_{OUT-}$ will have a duty cycle that is substantially close to 50% (e.g., as shown in FIG. 4).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A duty-cycle adjustment circuit, comprising:
an input to receive a differential pair of input signals;
a first clock generator to generate a first output signal based on the differential pair of input signals, the first clock generator comprising first pull-up circuitry to receive a first input signal of the differential pair, the first pull-up circuitry comprising two P-type metal-oxide semiconductor (PMOS) transistors coupled in series and two N-type metal-oxide semiconductor (NMOS) transistors coupled in parallel, and first pull-down circuitry to receive a second input signal of the differential pair, the first pull-down circuitry comprising two PMOS transistors and one NMOS transistor coupled in series, the first clock generator being configured to:
drive the first output signal to a logic-high state based on transitions of a first polarity in the first input signal; and
drive the first output signal to a logic-low state based on transitions of the first polarity in the second input signal;
a second clock generator to generate a second output signal based on the differential pair of input signals, the second clock generator comprising second pull-up circuitry to receive the second input signal, the second pull-up circuitry comprising two PMOS transistors coupled in series and two NMOS transistors coupled in parallel, and second pull-down circuitry to receive the first input signal, the second pull-down circuitry comprising two PMOS transistors and one NMOS transistor coupled in series, the second clock generator being configured to:
drive the second output signal to a logic-low state based on transitions of the first polarity in the first input signal; and
drive the second output signal to a logic-high state based on transitions of the first polarity in the second input signal; and
an output to provide the first output signal and the second output signal as a differential pair of clock signals.

2. The duty-cycle adjustment circuit of claim 1, wherein the first output signal has a 50% duty cycle.

3. The duty-cycle adjustment circuit of claim 1, wherein rising-edge transitions of the first output signal are aligned with rising-edge transitions of the first input signal, and wherein falling-edge transitions of the first output signal are aligned with rising-edge transitions of the second input signal.

4. The duty-cycle adjustment circuit of claim 1, wherein rising-edge transitions of the first output signal are aligned with falling-edge transitions of the first input signal, and wherein falling-edge transitions of the first output signal are aligned with falling-edge transitions of the second input signal.

5. The duty-cycle adjustment circuit of claim 1, wherein:
the first pull-up circuitry is configured to drive the first output signal to the logic-high state when the first input signal transitions from a first state to a second state; and
the first pull-down circuitry is configured to drive the first output signal to the logic-low state when the second input signal transitions from a third state to a fourth state.

6. The duty-cycle adjustment circuit of claim 5, wherein the pull-up circuitry is further configured to:
prevent the first output signal from transitioning to a different logic state when the second input signal transitions from the fourth state to the third state.

7. The duty-cycle adjustment circuit of claim 5, wherein the pull-down circuitry is further configured to:
prevent the first output signal from transitioning to a different logic state when the first input signal transitions from the second state to the first state.

8. The duty-cycle adjustment circuit of claim 5, wherein the first state and the third state are logic-low states, and wherein the second state and the fourth state are logic-high states.

9. The duty-cycle adjustment circuit of claim 5, wherein the first state and the third state are logic-high states, and wherein the second state and the fourth state are logic-low states.

10. A method, comprising:
receiving a differential pair of input signals;
generating a first output signal, using a first clock generator, based on the differential pair of input signals, wherein the first output signal is generated by:
providing a first input signal of the differential pair to first pull-up circuitry of the first clock generator, the first pull-up circuitry comprising two P-type metal-oxide semiconductor (PMOS) transistors coupled in series and two N-type metal-oxide semiconductor (NMOS) transistors coupled in parallel, and providing a second input signal of the differential pair to first pull-down circuitry of the first clock generator, the first pull-down circuitry comprising two PMOS transistors and one NMOS transistor coupled in series;
driving the first output signal to a logic-high state based on transitions of a first polarity in a first input signal of the differential pair; and
driving the first output signal to a logic-low state based on transitions of the first polarity in a second input signal of the differential pair;
generating a second output signal, using a second clock generator, based on the differential pair of input signals, wherein the second output signal is generated by:
providing the second input signal to second pull-up circuitry of the second clock generator, the second pull-up circuitry comprising 2 PMOS transistors coupled in series and two NMOS transistors coupled in parallel, and providing the first input signal to second pull-down circuitry of the first clock generator, the second pull-down circuitry comprising two PMOS transistors and one NMOS transistors coupled in series;
driving the second output signal to a logic-low state based on transitions of the first polarity in the first input signal; and
driving the second output signal to a logic-high state based on transitions of the first polarity in the second input signal; and
outputting the first output signal and the second output signal as a differential pair of clock signals.

11. The method of claim 10, wherein the first output signal has a 50% duty cycle.

12. The method of claim 10, wherein rising-edge transitions of the first output signal are aligned with rising-edge transitions of the first input signal, and wherein falling-edge transitions of the first output signal are aligned with rising-edge transitions of the second input signal.

13. The method of claim 10, wherein rising-edge transitions of the first output signal are aligned with falling-edge transitions of the first input signal, and wherein falling-edge transitions of the first output signal are aligned with falling-edge transitions of the second input signal.

14. The method of claim 10, wherein the generating comprises:
driving the first output signal to the logic-high state when the first input signal transitions from a first state to a second state; and
driving the first output signal to the logic-low state when the second input signal transitions from a third state to a fourth state.

15. The method of claim 14, wherein the generating further comprises:
preventing the first output signal from transitioning to a different logic state when the second input signal transitions from the fourth state to the third state.

16. The method of claim 14, wherein the generating further comprises:
preventing the first output signal from transitioning to a different logic state when the first input signal transitions from the second state to the first state.

17. The method of claim 14, wherein the first state and the third state are logic-low states, and wherein the second state and the fourth state are logic-high states.

18. The method of claim 14, wherein the first state and the third state are logic-high states, and wherein the second state and the fourth state are logic-low states.

* * * * *